United States Patent
Oh et al.

(10) Patent No.: US 9,169,561 B2
(45) Date of Patent: Oct. 27, 2015

(54) PLASMA ENHANCED CHEMICAL VAPOR DEPOSITION APPARATUS AND METHOD FOR CONTROLLING THE SAME

(75) Inventors: Junggeun Oh, Seoul (KR); Kwangho Lee, Changwon-si (KR); Jangwoo Lee, Seoul (KR); Jeonggyu Kim, Changwon-si (KR); Jinhyouk Shin, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 888 days.

(21) Appl. No.: 13/428,483

(22) Filed: Mar. 23, 2012

(65) Prior Publication Data

US 2012/0240856 A1   Sep. 27, 2012

(30) Foreign Application Priority Data

Mar. 25, 2011 (KR) .................. 10-2011-0026857
Dec. 22, 2011 (KR) .................. 10-2011-0140040
Dec. 23, 2011 (KR) .................. 10-2011-0141589

(51) Int. Cl.
*C23C 16/54* (2006.01)
*C23C 16/50* (2006.01)
*C23C 16/509* (2006.01)
*C23C 16/505* (2006.01)
*C23C 16/458* (2006.01)

(52) U.S. Cl.
CPC .............. *C23C 16/54* (2013.01); *C23C 16/458* (2013.01); *C23C 16/50* (2013.01); *C23C 16/505* (2013.01); *C23C 16/509* (2013.01)

(58) Field of Classification Search
CPC .... C23C 16/50; C23C 16/509; C23C 16/505; C23C 16/458; C23C 16/54
USPC ........... 118/719, 723 E; 156/345.43–345.47, 156/345.22
See application file for complete search history.

(56) References Cited

U.S. PATENT DOCUMENTS

| | | | |
|---|---|---|---|
| 5,215,420 A * | 6/1993 | Hughes et al. | 414/217 |
| 5,244,554 A * | 9/1993 | Yamagata et al. | 204/192.2 |
| 5,372,648 A | 12/1994 | Yamamoto et al. | |
| 5,474,611 A * | 12/1995 | Murayama et al. | 118/723 VE |
| 5,683,561 A * | 11/1997 | Hollars et al. | 204/298.25 |
| 5,958,134 A * | 9/1999 | Yasar et al. | 118/50 |
| 6,235,634 B1 * | 5/2001 | White et al. | 438/680 |
| 2003/0232150 A1 * | 12/2003 | Arnold et al. | 427/569 |
| 2004/0018305 A1 * | 1/2004 | Pagano et al. | 427/255.7 |
| 2005/0103271 A1 | 5/2005 | Watanabe et al. | |
| 2005/0132960 A1 | 6/2005 | Tanaka | |
| 2005/0239294 A1 * | 10/2005 | Rosenblum et al. | 438/778 |
| 2006/0021576 A1 | 2/2006 | Nolan et al. | |

(Continued)

FOREIGN PATENT DOCUMENTS

CN     1495285 A    5/2004
KR     10-2002-0088029 A    11/2002

(Continued)

*Primary Examiner* — Rudy Zervigon
(74) *Attorney, Agent, or Firm* — Birch, Stewart, Kolasch & Birch, LLP

(57) ABSTRACT

There is disclosed a plasma enhanced chemical vapor deposition apparatus including a loading station to load an object on a pallet, an operation station to form a functional film by performing plasma reaction to the object loaded on the pallet, a unloading station to separate the object from the pallet, a circulation station to convey the pallet from the unloading station to the loading station, and a conveyer to convey the pallet to the stations sequentially to circulate the pallet.

17 Claims, 12 Drawing Sheets

(56) References Cited

U.S. PATENT DOCUMENTS

| | | | |
|---|---|---|---|
| 2007/0082124 A1* | 4/2007 | Hartig | 427/109 |
| 2009/0115029 A1 | 5/2009 | Koyama et al. | |
| 2010/0092692 A1 | 4/2010 | Dulle et al. | |
| 2010/0298738 A1* | 11/2010 | Felts et al. | 600/576 |
| 2011/0100955 A1* | 5/2011 | Pushparaj et al. | 216/37 |
| 2011/0162704 A1* | 7/2011 | Le et al. | 136/256 |
| 2011/0174775 A1* | 7/2011 | Umeoka et al. | 216/58 |
| 2011/0252899 A1* | 10/2011 | Felts et al. | 73/865.8 |
| 2011/0263065 A1* | 10/2011 | Black et al. | 438/61 |
| 2011/0312189 A1* | 12/2011 | Kim et al. | 438/758 |
| 2013/0059092 A1* | 3/2013 | Mungekar et al. | 427/569 |

FOREIGN PATENT DOCUMENTS

| | | |
|---|---|---|
| KR | 10-2009-0084920 A | 8/2009 |
| KR | 10-2010-0018724 A | 2/2010 |
| KR | 10-2010-0096053 A | 9/2010 |

* cited by examiner

PLASMA ENHANCED CHEMICAL VAPOR DEPOSITION APPARATUS AND METHOD FOR CONTROLLING THE SAME

CROSS-REFERENCE TO RELATED APPLICATION

This application claims priority under 35 U.S.C. §119 from Korean Application No. 10-2011-0026857 filed Mar. 25, 2011, Korean Application No. 10-2011-0140040 filed Dec. 22, 2011, and Korean Application No. 10-2011-0141589 filed Dec. 23, 2011, the subject matter of which is incorporated herein by reference.

BACKGROUND OF THE INVENTION

1. Field of the Invention

Embodiments of the invention relate to a plasma enhanced chemical vapor deposition apparatus, and more particularly, to an apparatus for providing a functional film with corrosion resistance, hydrophilicity and antibiotic functions, and a method for controlling the apparatus.

In detail, the embodiments of the invention relate to a plasma enhanced chemical vapor deposition (PECVD) apparatus and a method for controlling the same.

2. Description of the Related Art

Throughout the industry there have been increasing demands for usage of a film (namely, a functional film) having a specific function that will be formed on a base material. This is because the functional film can compensate for the performance the base material lacks. For example, on a surface of a heat exchanger and a surface of a side mirror for a vehicle may be formed with a functional film having a predetermined function, such as corrosion resistance and hydrophilicity. As one of such examples, a heat exchanger for an air conditioner will be described as follows.

An air conditioner is an electric appliance having a function of controlling a desired temperature and humidity of a predetermined room. Such an air conditioner typically uses a freezing cycle and the freezing cycle, and includes a compressor, an evaporator, an expansion valve and a condenser. The evaporator and the condenser are types of heat exchangers, and they include a tube to enable flow of a refrigerant therein and a cooling fin installed in a tub. In other words, the refrigerant flowing in the evaporator and the condenser heat-exchange heat with ambient air. The evaporator may absorb the heat while evaporating the refrigerant and the condenser may emit the heat while condensing the refrigerant.

However, when a surface temperature of the heat exchanger falls below a dew point, air is condensed and a water droplet is generated on a surface of the heat exchanger. If the water droplet generation is severe, the water droplet is frozen to become a frost. The water droplet and/or the frost generated on the surface of the heat exchanger might cause several problems. For example, the water droplet and/or frost might reduce a heat exchange area to thereby deteriorate the heat exchanging performance of the heat exchanger. Also, the water droplet and/or frost might produce a kind of flow resistance, to increase the power required by a fan used to generate flow of air to the heat exchanger. Accordingly, it is preferable that the water droplet and the like are not condensed on the surface of the heat exchanger. To solve the problem, it has been attempted that the surface of the heat exchanger has hydrophilicity to cause flow of the condensed water droplet down the surface of the heat exchanger.

Meanwhile, a heat exchanger, especially, a heat exchanger installed in an outdoor unit of the air conditioner is exposed directly to an outside whereby corrosion might occur as usage time passes. Such a phenomenon might be severe when the heat exchanger is installed in salty conditions such as near a sea shore. Accordingly, it has been proposed that application of a corrosion resistance coating should be performed on a surface of the heat exchanger.

In addition, as the usage time passes, fungus and bacteria inhabit a surface of a heat exchanger and a bad smell might be generated, which might present a sanitary problem. However, the heat exchanger is typically mounted in an indoor or outdoor unit and it is not easy to clean the heat exchanger. As a result, it has been proposed that anti-bacteria/anti-fungi (hereinafter, antibiotic) coating should be provided on the surface of the heat exchanger.

Meanwhile, an apparatus having a functional film formed by using conventional plasma enhanced deposition and a method for controlling the same will be described as follows.

First of all, a base material is cleaned in a cleaning chamber. After that, the cleaned base material is deposited in a plasma reaction chamber for plasma reaction and a functional film is generated. The base material having the functional film formed therein is re-cleaned in the cleaning chamber. In other words, according to the conventional plasma enhanced deposition, pre-cleaning, functional film deposition and post-cleaning are performed in various chambers. Also, when forming the functional film, a corrosion resistance layer, a hydrophilicity film and an anti-biotic film are formed in different chambers, respectively. As a result, the conventional plasma enhanced deposition has to include independent chambers to perform each of the processes and each of the processes may be performed in each of the different chambers independently. Accordingly, the apparatus and control method for forming the functional layer might be disadvantageously complex.

Also, the conventional plasma enhanced deposition using conventional functional film forming technology has proposed that the functional film be formed on a raw material before manufacturing a product. In other words, it has been proposed that the functional film should be formed on the surface of the sheet shaped material before the sheet shaped material having the functional film formed thereon is processed to manufacture a radiation fin of the heat exchanger.

However, this has a problem of failing to manufacture the product having the functional film formed in all parts thereof. Also, the functional film is not formed on an area processed from a raw material, for example, a front sectional area, so that corrosion might be partially generated in the front sectional area. Accordingly, reliability of the product might be deteriorated.

To solve the problem, Korean Patent No. 10-2003-0078455 discloses a plasma enhanced chemical vapor deposition apparatus to form a functional film on a product itself.

In the conventional plasma enhanced chemical vapor deposition apparatus, a product is conveyed to a carrier to form the functional layer. An electric power is supplied to the product via the carrier in contact with a pair of rollers. Accordingly, the power supply is quite complex and the electric power is supplied via the rollers so that reliability of power supply might be deteriorated disadvantageously. Also, the functional film is formed on the carrier and efficiency might be deteriorated disadvantageously.

Moreover, the product, that is, the heat exchanger is transferred while being hung on the carrier. Accordingly, the transfer structure is complex and the electric power fails to be supplied between the carrier and the heat exchanger stably and this might cause a problem.

A single electrical connection point has to be formed in the heat exchanger and a uniform functional film cannot be formed in the heat exchanger entirely.

Meanwhile, in the conventional plasma enhanced chemical vapor deposition apparatus, it might not be easy to load and unload the heat exchanger. Accordingly, the work process happens to be inefficient and it might be difficult to install and separate the carrier.

SUMMARY OF THE INVENTION

Accordingly, embodiments of the invention are directed to a plasma enhanced chemical vapor deposition apparatus and a method for controlling the same. To solve the problems, an object of the embodiments of the invention is to provide an apparatus including a simple and efficient functional layer and a method for controlling the apparatus.

Another object of the embodiments of the invention is to provide an apparatus including a functional film that can be mass-productive by supplying an electric power stably, and a method for controlling the same.

A further object of the embodiments of the invention is to provide an apparatus including a functional film that enables a worker to load and unload a product.

A still further object of the embodiments of the invention is to provide a plasma enhanced chemical vapor deposition apparatus of which an electric pole is accessible via a side door to ease maintenance.

A still further object of the embodiments of the invention is to provide a plasma enhanced chemical vapor deposition apparatus that prevents an electric pole from increasing to maintain the electric pole stably and that can ease installation and separation of the electric pole.

In an embodiment, a plasma enhanced chemical vapor deposition apparatus includes a loading station to load an object on a pallet; an operation station to form a functional film by performing plasma reaction to the object loaded on the pallet; a unloading station to separate the object from the pallet; a circulation station to convey the pallet from the unloading station to the loading station; and a conveyer to convey the pallet to the stations sequentially to circulate the pallet.

The operation station may include a chamber to receive the object therein.

In the chamber there may be provided a power supplier to selectively supply an electric power to the pallet within the chamber; and an electric pole having an opposite polarity to the power supplier.

The plasma enhanced chemical vapor deposition apparatus may further include a entry door to selectively open and close the chamber.

The conveyer may include a front part provided in front of the entry door to convey to convey the pallet to the chamber.

The conveyer may include an elevator to change a vertical position of the pallet. The change of the vertical position of the pallet may enable a worker to adjust the loading height and the unloading height for the object efficiently. The elevator may be used for circulating the pallet.

The conveyer may include an internal part to convey the pallet within the chamber.

The plasma enhanced chemical vapor deposition apparatus may further include a rear door to selectively open and close the chamber.

The conveyer may include a rear part provided in front of the entry door to convey to convey the pallet to the chamber.

The rear part may include an elevator to change a vertical position of the pallet.

The conveyer comprises a connecting part provided outside the chamber to convey the pallet from the front part to the rear part.

The electric pole may include at least a couple of electric surfaces facing each other.

A side door may be formed in a side surface of the chamber to selectively open and close the chamber and the electric pole is provided in the side door.

The electric surface may include a net-shaped plasma reacting surface and an electric pole holder supporting the reacting surface at both sides of the reacting surface.

A holder coupler may be provided in an inner wall of the chamber to support the electric pole holder and the holder coupler may be elastically supported to generate an elastic force in an outward direction of the holder coupler.

The electric surface may include a plurality of layers and a nozzle is provided between the layers of the plasma reacting surface to supply a reaction gas, a precursor and a carrier gas.

The nozzle may be formed in a surface of a circular tube along a longitudinal direction of the circular tube and a heater may be buried in a rear surface of the circular tube.

The circular tub may be positioned in front of an electric surface.

The power supplier may include a moving contact moving forwardly to selectively contact a contact of the pallet.

In an embodiment, a plasma enhanced chemical vapor deposition apparatus for forming a functional film on a heat exchanger, the apparatus includes: a loading station to load the heat exchanger on to a pallet; an operating station to receive the pallet from the loading station, and provide the functional film on the heat exchanger positioned on the pallet by using a plasma reaction; an unloading station to unload the heat exchanger having the functional film coated thereon from the pallet; and at least one conveyer to return the pallet from the unloading station to the loading station.

The operating station may include a chamber to hold the heat exchanger therein.

The plasma enhanced chemical vapor deposition apparatus may further comprise a power supplier to selectively supply electric power to the pallet and at least one electric pole to be supplied with electric power of an opposite polarity to a polarity of the electric power of the power supplier, wherein the power supplier and the electric pole are provided inside the chamber.

The plasma enhanced chemical vapor deposition apparatus may further comprise an entry door provided to the chamber to selectively open and close the chamber.

The at least one conveyer may include a front part provided in front of the entry door to convey the pallet in to the chamber.

The at least one conveyer may include a first elevator to move the pallet vertically.

The at least one conveyer may include an internal part provided inside the chamber.

The plasma enhanced chemical vapor deposition apparatus may further comprise an exit door provided in the chamber in an opposite position to the entry door to selectively open and close the chamber.

The at least one conveyer may include a rear part provided behind the exit door to convey the pallet out of the chamber.

The rear part may include a second elevator to move the pallet vertically.

The at least one electric pole may include at least a pair of conductive members facing each other.

The plasma enhanced chemical vapor deposition apparatus may further comprise a side door provided to a lateral side of the chamber to selectively open and close the chamber, and one of the conductive members is provided to the side door.

Each conductive member may include a plasma reacting member and a pair of electric pole holders to hold the plasma reacting member at both sides of the plasma reacting member, respectively.

The plasma enhanced chemical vapor deposition apparatus may further comprise a holder coupler to support the at least a couple of electric pole holders, wherein the holder coupler is elastically supported to generate an elastic force in an outward direction of the holder coupler.

The conductive members may forms a plurality of slots and a nozzle is provided between the conductive members to supply a reaction gas, a precursor and a carrier gas.

The plasma enhanced chemical vapor deposition apparatus may further comprise a circular tube, wherein the nozzle is formed along a longitudinal direction of a front part of the circular tube, and a heating wire is wound along a longitudinal direction of a rear part of the circular tube.

The circular tube may be located in front of the conductive member.

The power supplier may include a moving contact to selectively contact with a pallet contact of the pallet.

The apparatus for providing the functional film and the method for controlling the same may have following effects.

First of all, a product having a functional film such as corrosion resistance, hydrophilicity and antibiotic functions may be manufactured more simply and efficiently.

Furthermore, the apparatus according to the embodiments of the invention are mass-productive and production cost may be reduced effectively by supplying an electric power to the product stably.

Still further, the apparatus according to the embodiments of the invention may provide the pallet for a worker to load and unload the product smoothly. In other words, the user may load and unload the product by using the pallet and the pallet may be circulated by the conveyer. Accordingly, the worker needs not make efforts to convey and install the pallet and efficient working may be performed.

Still further, the apparatus according to the embodiments of the invention may include the nozzle to supply precursors and prevent damage to the tube having the nozzle therein. Accordingly, the damaged tub may be replaced and usage may be enhanced.

Still further, the apparatus according to the embodiments of the invention may include the side door the worker can access to easily. Repair and maintenance may be performed easily and conveniently.

Still further, the apparatus according to the embodiments of the invention may prevent an electric pole from increasing as the electric pole is used. Accordingly, the electric pole may be maintained stably and it may be easy to install and separate the electric pole.

It is to be understood that both the foregoing general description and the following detailed description of the embodiments or arrangements are by example and explanatory and are intended to provide further explanation of the embodiments as claimed.

BRIEF DESCRIPTION OF THE DRAWINGS

Arrangements and embodiments of the invention are described in detail with reference to the following drawings in which like reference numerals refer to like elements and wherein.

DETAILED DESCRIPTION OF THE EMBODIMENTS

Reference will now be made in detail to specific embodiments, examples of which are illustrated in the accompanying drawings. Wherever possible, same reference numbers will be used throughout the drawings to refer to the same or like parts.

As follows, a heat exchanger will be embodied as one of examples having a functional film and the embodiments of the invention are not limited thereby. The embodiments of the invention are applicable to other products.

Figure 1:
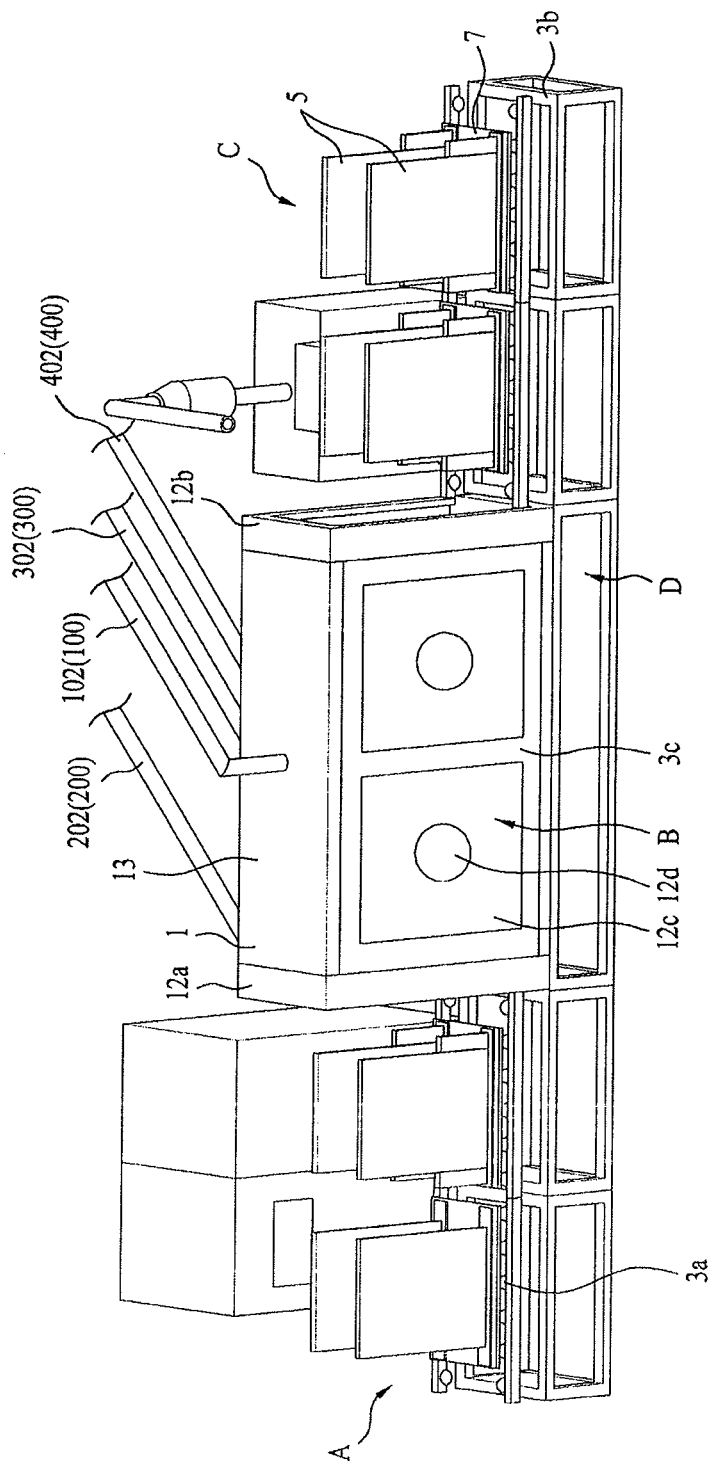
FIG. 1 is a perspective view of a plasma enhanced chemical vapor deposition apparatus according to an embodiment of the invention.

First of all, in reference to FIG. 1, a detailed configuration of an apparatus providing a functional film according to an example embodiment of the invention will be described.

According to this embodiment of the invention, a heat exchanger 5 may be provided to a chamber 1 that provides a functional film to an object by performing a plasma reaction. In other words, an auxiliary chamber to clean the heat exchanger 5 need not be provided before and after the plasma reaction but such a function may be performed in a single chamber 1 according to the embodiment of the invention. The plasma reaction is performed on an object, for example, the heat exchanger 5 or other items, held in the chamber 1 may be supplied or provided with the functional film.

The chamber 1 may be connected with a precursor supply unit 400 to supply a precursor to the chamber 1, and with a reaction gas supply unit 300 to supply reaction gas to the chamber 1. Also, the chamber 1 may be connected with a cleaning gas supply unit 200 to enable supply to the chamber 1 a cleaning gas used for cleaning the heat exchanger 5 both before and after the plasma reaction. The chamber 1 may be connected with an exhaustion unit 100 to exhaust gases from the chamber 1 In other words, the cleaning gas remaining after the cleaning and gases remaining after the plasma reaction are exhausted to the outside of the chamber 1.

Figure 2:
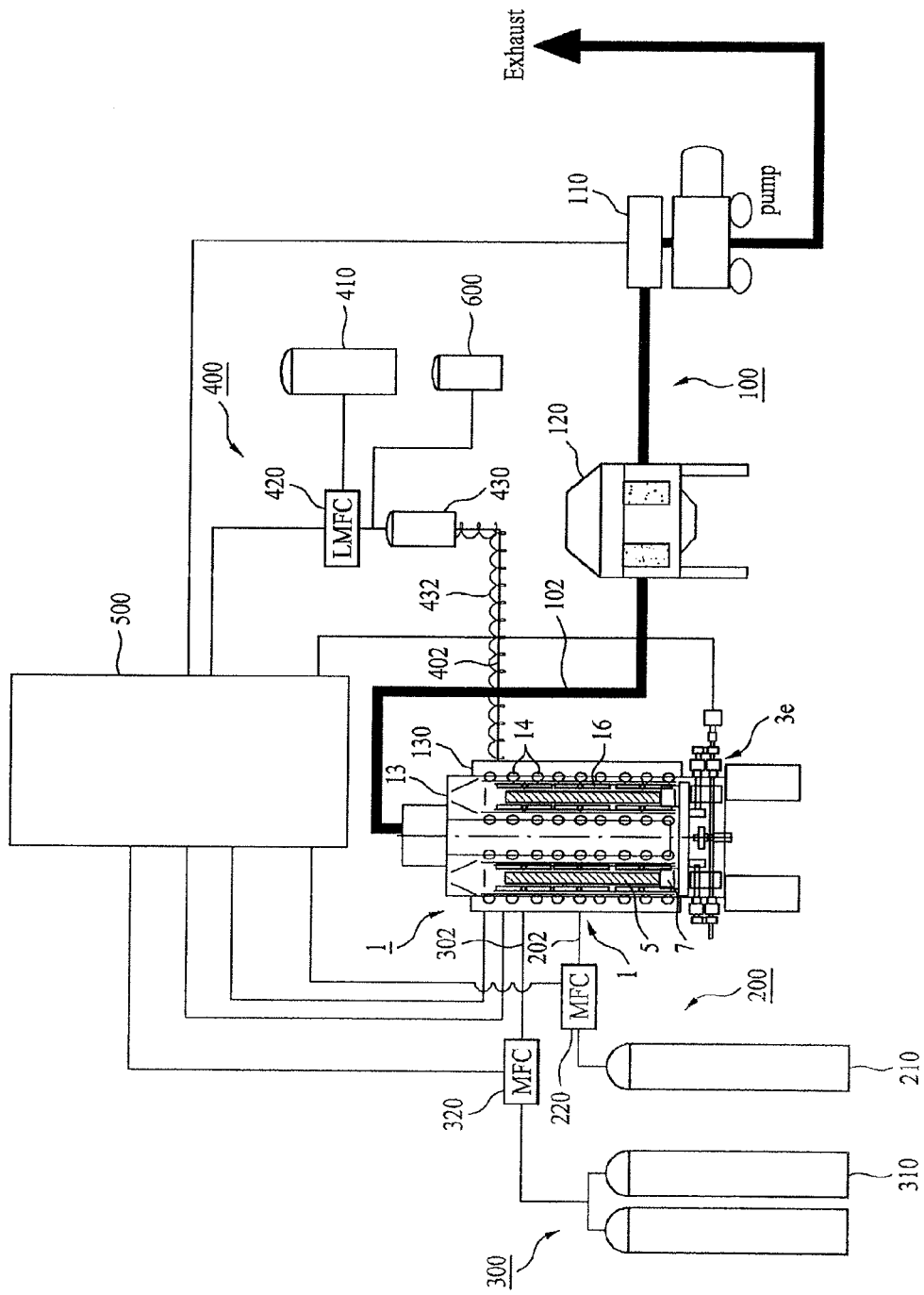
FIG. 2 is a block view of a plasma enhanced chemical vapor deposition apparatus shown in FIG. 1.

The precursor supply unit 400, the reaction gas supply unit 300, the cleaning gas supply unit 200 and the exhaustion unit 100 may be controlled by a control unit 500 as shown in FIG. 2.

According to the embodiment of the invention, the chamber 1 may be a predetermined room or space to provide a functional film to the object, such as a heat exchanger 5, for example, a product or a part to which an additional mechanical process will not be performed. As a result, a conveyer may be required to convey the object.

Specifically, the embodiment of the invention may further include a pallet 7 connected with the object mechanically and electrically. The object may be loaded on the pallet 7 stably and supportably. An electric power may be applied to the object via the pallet 7.

Meanwhile, the chamber 1 may include a front door (or an entry door) 12a provided to selectively open and close the chamber 1. The heat exchanger 5 may be placed into the chamber 1 via the front door 12a, and the functional film may be provided while the heat exchanger 5 is in the chamber 1. As a result, regions located before (or in front of) and after (or behind) the front door 12a may be referred to as a loading station (A) and an operation station (B), respectively. In this instance, the operation station (B) may be an internal room of the chamber 1.

As mentioned above, the embodiment of the invention may provide one or more functional films in quantity (or bulk) to the object. For that, a conveyer 3 may be provided to convey the heat exchanger 5 into the chamber 1. In other words, the conveyer 3 may convey the heat exchanger 5 from outside the chamber 1 (the loading station A) to inside of the chamber 1 (the operation station B).

More specifically, the heat exchanger 5 may be connected with the pallet 7 mechanically and electrically. That is, the heat exchanger 5 may be loaded on the pallet 7 stably and supportably, and the heat exchanger 5 may be connected with the pallet 7 electrically. The pallet 7 may be conveyed by the conveyer 3 directly and the object (e.g., the heat exchanger 5) may be conveyed indirectly via the pallet 7.

The conveyer 3 may include a front part 3a provided in front of the front door 12a to convey the pallet 7 to the chamber 1. Also, the conveyer 3 may include an internal part 3c to convey the pallet 7 within the chamber 1.

The internal part 3c may be configured to convey the pallet 7 to a preset position inside the chamber 1. In other words, the preset position is a position to apply the electric power to the object to provide the functional film.

The loading and unloading of the heat exchanger 5 and the providing of the functional film may be enabled by the front part 3a, the front door 12a and the internal part 3c mentioned above. The heat exchanger 5 to be provided with the functional film may be unloaded using the internal part 3c, the front door 12a and the front part 3a. In this instance, a loading station (A) and an unloading station (B) may be identical. That is, the loading and unloading of the heat exchanger 5 may be performed in the front of the front door 12a.

However, the loading station and the unloading station are overlapped in this instance, and it may be difficult to perform the work smoothly. This is because the loading after the unloading has to be performed at the same position after the functional film is formed. In other words, the unloading or the loading cannot be performed while the functional film is being formed so that the work performance time increases disadvantageously.

To solve this problem, a rear door (or an exit door) 12b may be provided in the chamber 1. Like the front door 12a, the rear door 12b may selectively open and close the chamber 1, and the heat exchanger 5 provided with the functional film may be taken out to the outside of the chamber 1 via the rear door 12b.

The conveyer 3 may include a rear part 3b provided behind the rear door 12b to convey the pallet 7 to the outside of the chamber 1. As a result, the object (e.g., the heat exchanger 7) provided with the functional film may be taken out to the outside of the chamber 1 by the internal part 3b, the rear door 12b and the rear part 3b. The rear region behind the rear door 12b may be referred to as an unloading station (C) that unloads the object.

The structure of the conveyer 3 may enable the loading of the object, the providing of the functional film and the unloading of the object in series. Accordingly, the functional films may be provided to the objects en masse.

Specifically, the conveyer 3 may include the front part 3a, the internal part 3c and the rear part 3b which are partitioned off from each other. However, those parts may be configured to convey the pallet 7 in series. In this instance, the expression of 'partitioned' may refer to 'partitioned spatially' and 'controllable independently'.

The pallet 7 may be conveyed on the conveyer 3. In this instance, the heat exchanger 5 may be loaded on the pallet 7. As a result, the loading of the heat exchanger 5, the providing of the functional film to the heat exchanger 5 and the unloading of the heat exchanger 5 may be serially performed through the use of the pallet 7 and the parts of the conveyer 3.

Meanwhile, the embodiment of the invention may provide a structure enabling the pallet 7 to circulate. In other words, the structure may enable the pallet 7 having the heat exchanger 5 loaded thereon that is in the unloading station (C) to be conveyed back to the loading station (A) again. For that, the apparatus according to the embodiment of the invention includes a circulation station (D). As a result, the conveyer 3 may convey the pallet 7 from the loading station (A), to the operation station (B), to the unloading station (C) and to the circulation station (D) to thereby circulate through the various stations in order.

As mentioned above, the apparatus according to this embodiment of the invention may have a following configuration to provide the functional film. In other words, the apparatus according to the embodiment of the invention may include the chamber 1, the precursor supply unit 400, the reaction gas supply unit 300, the cleaning gas supply unit 200, an exhaustion unit 100 and the control unit 500.

In reference to FIG. 2, each of the component parts will be described as follows, First of all, the chamber 1 will be described.

In the body 13 of the chamber 1 may be provided the electric pole 16 to generate the plasma reaction and the nozzle 14 to exhaust the precursor, the reaction gas and the cleaning gas. The heater may be provided in the chamber 1 to control the temperature inside the chamber 1. The component parts provided for the plasma reaction such as the electric pole 16, the nozzle 14 and the heater may be provided in the chamber 1.

A side door 12c may be formed in a lateral side of the chamber 1. A window 12d may be provided in the side door 12c, and an internal room of the chamber 1 may be visible via the window 12d.

The side door 12c may be provided for the worker to have access to the internal room of the chamber 1. As a result, the number of the side doors 12c may be provided corresponding to the number of the pallets 7 positioned in the chamber 1. According to this embodiment of the invention, two side doors 12c may be formed in a lateral side of the chamber 1 and two side doors 12c may be formed in an opposite lateral side of the chamber 1.

As shown in FIG. 2, a partition wall 18 may be provided in a center of the chamber 1 to partition off the chamber 1 into both (or two) parts. The plasma reaction may be performed in each of the both parts partitioned by the partition wall 18. For example, the heat exchangers 5 loaded in a left side of the pallet 7 may be exposed to the plasma reaction from a left part of the chamber 1 with respect to the partition wall 18 and the heat exchangers 5 loaded on a right side of the pallet 7 may be exposed to the plasma reaction from a right part of the chamber 1 with respect to the partition wall 18.

As a result, electric poles may be provided in both parts of the chamber with respect to the partition wall 18, respectively. In this instance, a lower part of the partition wall may be open. In other words, the pallet may be conveyed via the open part. The open part may be positioned in a center of the pallet and objects may be loaded on fixing parts formed in both sides of the pallet. Accordingly, the objects may be loaded in parallel and the plasma reaction may be performed to the objects simultaneously.

For the plasma reaction, the component parts including the electric pole 16, the nozzle 14 and the heater may be provided in each of the both parts of the chamber 1 with respect to the partition wall 18. Also, the component parts may be provided at the side door 12c facing the partition wall 18. As a result, the worker can open or access the chamber 1 via the side door 12c and he or she may approach or access the chamber 1 for repair and maintenance of the chamber 1 with ease.

Meanwhile, according to the embodiment of the invention, the pre-cleaning, the post-cleaning and the plasma reaction may be performed in the chamber 1. The precursor supply unit 400, the reaction gas supply unit 300, and the cleaning gas supply unit 200 have to be connected with the chamber 1. Of course, the exhaustion unit 100 to exhaust remnants after the cleanings and the plasma reaction to the outside of the chamber 1 may be connected with the chamber 1.

The precursor supply unit 400 will be described as follows.

According to a conventional technology, different chambers may be provided for corrosion resistance, hydrophilicity and antibiotic functions, respectively. A precursor is provided in each of the chambers. However, according to this embodiment of the invention, a single precursor for the corrosion resistance, hydrophilicity and antibiotic functions, which will be described later in detail, may be used, and a film having the corrosion resistance, the hydrophilicity and the antibiotic functions may be formed in the single chamber 1 at one time. As a result, a single precursor supply unit 400 may be provided.

A supply pipe 402 may connect a container 410 containing a liquid precursor and the chamber 1 with each other. A flowing control part 420 to control the flowing of the liquid precursor and a vaporizer 430 to vaporize the liquid precursor may be provided at a predetermined position of the supply pipe 402. To flow the liquid precursor efficiently, a carrier gas tank 600 may be connected with a predetermined position of the supply pipe 402. Also, a heat generating part 432, such as a heating wire, may be provided in the supply pipe 402 provided between the vaporizer 430 and the chamber 1, to maintain the vaporized status of the precursor.

The precursor may be a precursor (hereinafter, a multi-functional precursor) capable of forming a film having the corrosion resistance, the hydrophilicity and the antibiotic functions. The carrier gas may be helium and/or argon, and since the carrier gas may be identical to the carrier gas according to the conventional technology, a detailed description thereof will be omitted accordingly.

The reaction gas supply unit 300 will be described as follows.

A supply pipe 302 may be provided between a container 310 containing a reaction gas and the chamber 1. A flow controlling part 320 to control the flow of the reaction gas may be provided at a predetermined position of the supply pipe 302. The reaction gas may be air, oxygen and/or helium.

The cleaning gas supply unit 200 will be described as follows.

A supply pipe 202 may be provided between a container 210 containing a cleaning gas and the chamber 1. A flow controlling part 220 may be provided in a predetermined position of the supply pipe 202 to control the flow of the cleaning gas. The cleaning gas may be air. Those configurations may be similar to those of the conventional technology so that detailed descriptions thereof will be omitted accordingly. If air is used as the reaction gas, the cleaning gas supply unit 200 may be not provided, and the reaction gas supply unit 300 may be substituted for the cleaning gas supply unit 200.

The exhaustion unit 100 to exhaust the gases remaining in the chamber 1 to the outside the chamber 1 will be described as follows.

An exhaustion pipe 102 may be provided between a pump 110 used to exhaust the gases remaining in the chamber 1 to the outside and the chamber 1. A filter 120 may be provided at a predetermined position of the exhaustion pipe 102 to filter the gases exhausted to the outside. The pump 110 may exhaust the gases from the inside of the chamber 1 to the outside, and it may be a vacuum pump to exhaust the gases to the outside of the chamber 1 and to make the inside of the chamber 1 be a vacuum state.

The control unit 500 will be described as follows.

The control unit 500 may control the chamber 1, the precursor supply unit 400, the reaction gas supply unit 300, the cleaning gas supply unit 200 and the exhaustion unit 100. Also, the control unit 500 may control the conveyers 3a, 3c and 3b that convey the pallet 7 having the heat exchangers 5 loaded thereon.

Figure 3:
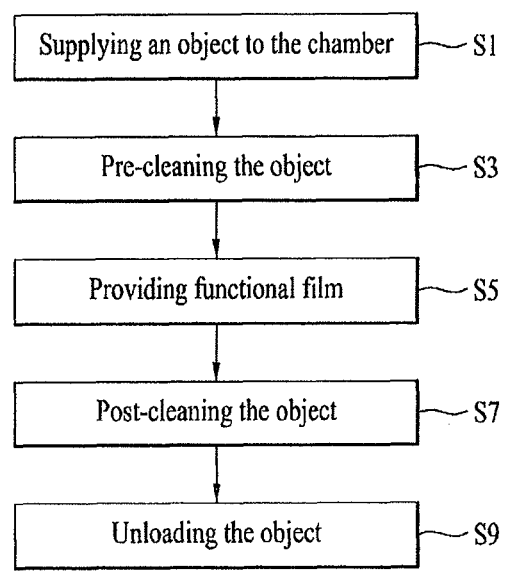
FIG. 3 is a flow chart illustrating a method for depositing plasma according to an embodiment of the invention.

In reference to FIGS. 2 and 3, a method for controlling an apparatus for providing a functional film according to an embodiment of the invention will be described as follows.

First of all, an object (the heat exchanger 5 according to this embodiment of the invention) may be supplied to the chamber 1 (a supplying operation, S1). Given the heat exchanger 5 in the chamber 1, the cleaning gas may be supplied to the chamber 1 to clean the heat exchanger 5 (pre-cleaning operation, S3). In this instance, when the heat exchanger is clean already, this operation may be omitted or skipped.

After the heat exchanger 5 is cleaned, the precursor may be supplied to the chamber 1 to generate a plasma reaction and the functional film may be provided to the heat exchanger 5 (functional film providing operation, S5). After the functional film is formed, the cleaning gas may be supplied to the chamber 1, and the heat exchanger 5 having the functional film formed therein may be re-cleaned (post-cleaning operation, S7). Lastly, the heat exchanger 5 having the functional film formed therein may be unloaded to the outside of the chamber 1 (unloading operation, S9).

Each of the operations will be described in detail as follows.

The supplying operation (S1) to supply or load the heat exchanger 5 to the chamber 1 will be described. The heat exchanger 5 may be loaded on the pallet 7, and the pallet 7 having the heat exchanger 5 loaded thereon may be conveyed by the front part 3a of the conveyer 3 to the chamber 1. In other words, the front door 12a may be opened and the front part 3a and the internal part 3c of the conveyer 3 may be driven. After that, the heat exchanger 5 may be conveyed into the chamber 1. Once the introduction of the heat exchanger 5 into the chamber is complete, the front door 12a may be closed.

Meanwhile, the parts of the conveyers 3a, 3c and 3b may be controlled independently or in communication with each other. When they are controlled in communication with each other, the introduction and exhaustion of the different heat exchangers 5 may be performed simultaneously.

The pre-cleaning operation (S3) to clean the heat exchanger 5 before forming of the functional film will be described. The cleaning gas supply unit 200 may supply the cleaning gas to the chamber 1, and the heat exchanger 5 may be cleaned by the cleaning gas. Once cleaning of the base material is complete, the gas remaining inside the chamber 1 may be exhausted by the pump 110 provided in the exhaustion unit 100. During the process, the gas may be exhausted until the internal room of the chamber reaches 1 an initial vacuum level.

The functional film providing operation (S5) to form or provide the functional film on the heat exchanger 5 will be described. First of all, the gases remaining in the chamber 1 may be substantially exhausted to the outside of the chamber 1 by using the exhaustion unit 100, especially, by operating the pump 110, to make a vacuum level of the chamber 1 reach a workable vacuum level. Also, the chamber 1 may be controlled to have a temperature by using a heater provided in the chamber 1 to make the chamber 1 satisfy a preset temperature condition.

The electric power may be provided for supply to the heat exchanger 5, specifically, the pallet 7, which will be described later.

Once the internal condition of the chamber 1 is fitted to the plasma reaction, that is, once the vacuum level inside the chamber 1 reaches the workable vacuum level, the flow controlling part 320 of the reaction gas supply unit 300 may be controlled and the reaction gas may be supplied to the chamber 1. Also, the precursor may be supplied to the chamber by controlling the flow controlling part 420 of the precursor supply unit 400.

The quantity and supply time of the reaction gas, the quantity and supply time of the precursor, and the plasma reaction time may be controlled to be optimal or workable.

The post-cleaning operation to clean the heat exchanger 5 having the functional film formed thereon will be described. The cleaning gas may be supplied to the chamber 1 by the cleaning gas supply unit 200, and the heat exchanger 5 having the functional film formed thereon may be cleaned by the cleaning gas. Once the cleaning is complete, the gas may be exhausted to the outside of the chamber 1 by operating the pump 110 of the exhaustion unit 100.

Meanwhile, the post-cleaning operation may be performed right after the completion of the plasma reaction. In other words, the cleaning gas may be supplied after the plasma reaction completion and it may be possible to exhaust the reaction remnants and clean the heat exchanger 5 simultaneously.

The plasma reaction may be performed by supplying the electric power to the heat exchanger 5. As a result, when the plasma reaction is complete, an operation performed to supply the electric power to the heat exchanger will be cleared. Such the power supply clearing operation may be performed after the completion of the plasma reaction. Alternatively, the power supply clearing operation may be performed after the post-cleaning operation.

Once the post-cleaning operation is completed, a vent operation to relieve a pressure difference between an inner space and an external space with respect to the chamber may be performed.

The unloading operation to unload the heat exchanger 5 having the functional film formed thereon from the chamber 1 will be described. The heat exchanger 5 having the functional film and loaded on the pallet 7 may be conveyed outside the chamber 1 by the parts 3a, 3c and 3b of the conveyer 3. As a result, introduction and exhaustion of the heat exchanger 5 may be performed simultaneously. Also, during the plasma reaction, the loading and unloading of the heat exchangers 5 may be performed simultaneously. Accordingly, forming of the functional film en masse through use of a series of operations is possible.

Figure 4:
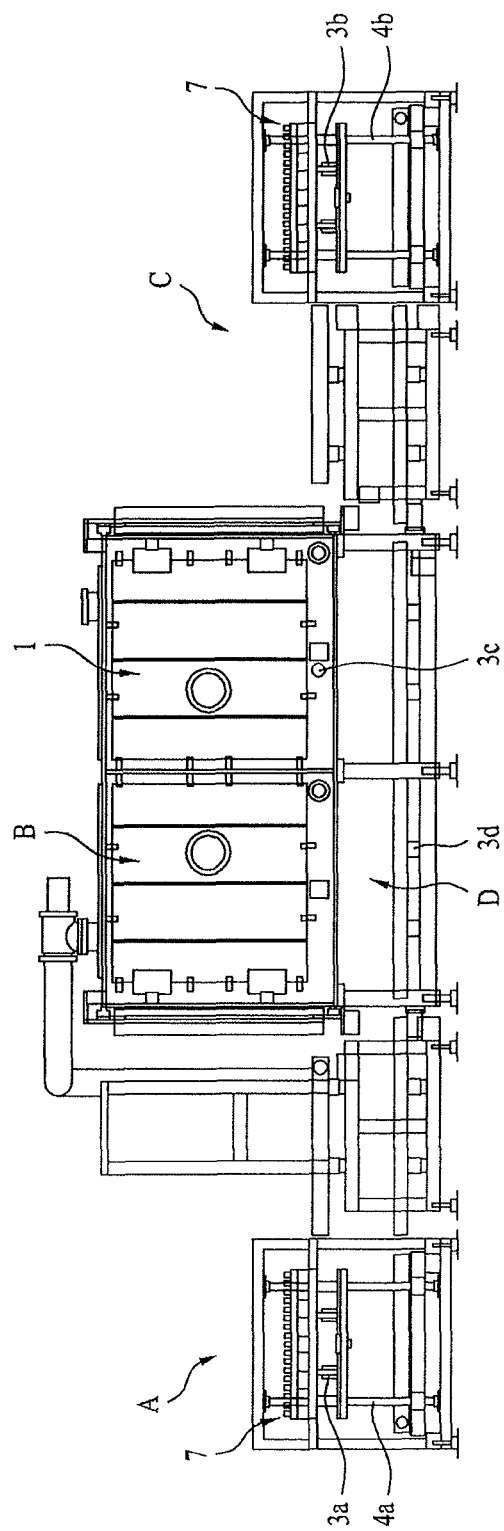
FIG. 4 is a front view illustrating a circulation of a pallet shown in FIG. 1.

In reference to FIG. 4, the circulation of the pallet 7 with respect to the conveyer 3 will be described in detail as follows.

In an embodiment of the invention as mentioned above, two heat exchangers 5 may be loaded on a single pallet 7 at both sides thereof. The chamber 1 may hold two pallets 7 along a longitudinal direction. In this instance, a single plasma working may provide functional films to the heat exchangers 5 loaded on the two pallets 7, that is, four heat exchangers 5, respectively. The chamber 1 may be configured to hold two or more pallets 7. Also, two or more objects (e.g., the heat exchangers 5) may be loaded on a single pallet 7.

For increased work efficiency, a first set of two pallets 7 may be located in the loading station (A) along a longitudinal direction of the pallets 7, and a second set to two pallets 7 may be located even in the unloading station (B) along the longitudinal direction. In this instance, additional third set of two pallets 7 may be located in the chamber 1. Thus, such pallets 7 may be positioned on the front part 3a, the internal part 3c and the rear part 3b.

For the circulation of the pallets 7, the conveyer 3 may include a connecting part 3d to convey the pallet 7 from the rear part 3c to the front part 3a. The connecting part 3d may be provided outside the chamber 1. Especially, the connecting part 3d may be provided below the chamber 1.

More specifically, the connecting part 3d may be positioned under the other parts of the conveyer 3 in parallel.

The front part 3a and the rear part 3b may include elevators 4a and 4b, respectively, to change perpendicular positions of the pallet 7.

First of all, once the unloading of the heat exchanger 5 is completed in the unloading station (C), the pallet 7 may be conveyed downwardly by the operation of the elevator 4b. After that, the pallet 7 may be conveyed to the loading station (A) by the connecting part 3d from the circulation station (D). In this instance, the pallet 7 may be positioned downside and it may be elevated by the operation of the elevator 4a. The elevators 41 and 4b may be configured to elevate the pallet 7. Accordingly, the pallet may be circulated by each of the component parts provided in the conveyer 3.

In this instance, the loading and the unloading may be performed by a worker. The perpendicular positions of the loading and the unloading may be very important for work efficiency. The perpendicular positions in this instance may be different from perpendicular positions of the pallet 7 inside the chamber 1.

As a result, the elevators 4a and 4b may be adjusted to have a plurality of preset heights. In other words, the perpendicular height may be adjusted for a conveying position and a circulating position. Also, it may be adjusted for a loading position and an unloading position. The loading and unloading positions may be located between the conveying position and the circulating position, and be higher than the conveying position.

Meanwhile, it might take a much time to convey the pallet 7 to circulate to the loading station (A) from the unloading station (C). Accordingly, the pallet 7 may be provided in the circulating station (D). In other words, once forming of the functional film is complete, the pallet 7 positioned in the circulating station (D) may be conveyed to the loading station (A) and the pallet 7 positioned in the unloading station (C) may be conveyed to the circulating station (D). As a result, it may be possible to reduce the time taken to circulate the pallets 7 remarkably.

Flow of processes relating to the circulation of the pallets 7 will be described.

The loading in the loading station (A), the functional film being provided in the operating station (B) and the unloading in the unloading station (C) may be performed simultaneously. The pallet 7 having no heat exchangers 5 loaded thereon may be waiting in the circulating station (D). When the work is completed, each of the pallets 7 positioned in each of the stations may be conveyed to the next station sequentially. As a result, serial work may be performed and the work process time may be reduced noticeably.

The pallet 7 according to an embodiment of the invention will be described in detail in reference to FIGS. 5 and 8 as follows.

Figure 5:
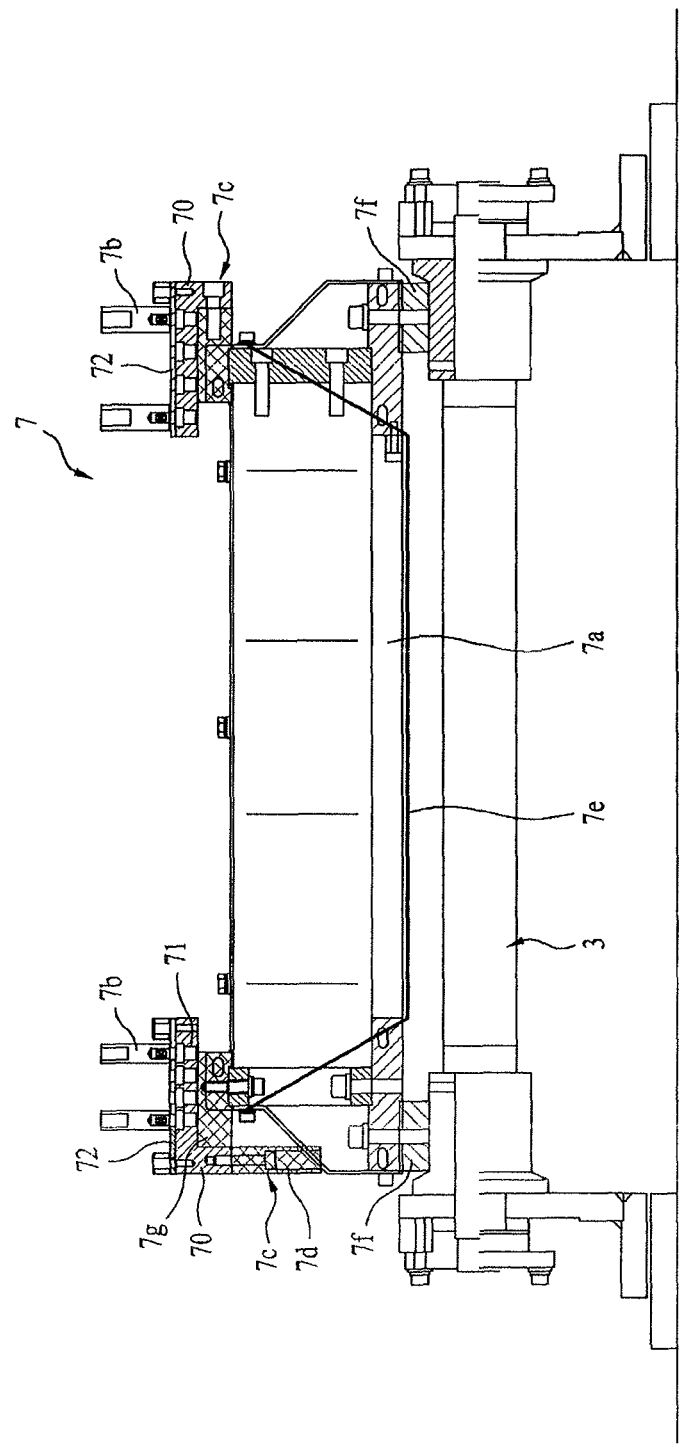
FIG. 5 is a sectional view of the pallet.

FIG. 5 is a sectional view illustrating the pallet 7 positioned on the conveyer 3 according to an embodiment of the invention.

The pallet 7 may include a base 7a. The base 7a may be positioned at an upper area of the conveyer 3 to be directly conveyed by the conveyer 3. The connection between the conveyer 3 and the base 7a may enable transfer of the pallet 7 stably without the pallet 7 rolling horizontally. Meanwhile, an electric power may be directly applied to the pallet 7, and not via the conveyer 3, which will be described in detail later. Accordingly, the electric power may be applied to the pallet 7 stably.

In this instance, the electric power has to be prevented from being applied to the conveyer 3 via the pallet 7. If the electric power is applied to the conveyer 3, unnecessary functional films might be formed on the conveyer 3. To prevent that, an insulation material 7f may be provided between the conveyer 3 and the base 7a of the pallet 7. The insulation material may be coupled to a back surface of the base 7a.

Meanwhile, the pallet 7 may include a jig 7b to load the heat exchanger 5 thereon. In other words, the jig 7b may be provided to fix the object. The plurality of the jigs 7b may be provided, to fix the heat exchanger 5 more stably.

The plurality of the jigs 7b may be provided along a longitudinal direction of the pallet to support the object more stably and to form an electrical contact, or they may be provided along a transverse direction of the pallet. As a result, a plurality of supporting points and electrical contacts may be formed for a single product. This can result in stable supporting of the product and uniform power supply to the product, such that a uniform functional film may be formed on the entire region of the product.

The pallet 7 may include a fixing part 7c coupled to the jig 7b from a top side of the base 7a, to fix the heat exchanger 5 to the pallet 7.

A plurality of fixing parts 7c may be formed. The fixing parts 7c may be formed in both sides of the pallet 7 along a longitudinal direction of the pallet 7, respectively. As a result, two heat exchangers 5 may be loaded on a single pallet 7. The plurality of the heat exchangers may be loaded along a longitudinal direction of the single fixing part. The fixing part 7c may include a pallet contact 7d. In other words, the electric power may be applied to the pallet 7 via the pallet contact 7d.

The pallet contact 7d may be provided to one of the fixing parts 7c. This is because a position to supply the electric power to a single pallet may be one. Accordingly, one of the fixing parts 7c may be electrically connected with the other one of the fixing parts 7c via a connecting wire 7e. In other words, the fixing part 7c and the base 7a may not be electrically connected with each other. This is because an unnecessary functional film should not be formed on the pallet 7. As a result, the fixing part 7c and the base 7a may be insulated from each other and the insulating material 7g may be disposed between them. The insulating material 7g may be disposed between the pallet contact 7d and the base 7a to insulate them from each other.

Accordingly, the electric power may be provided only to the fixing part and a connecting wire may be connected to the fixing parts to electrically connect them with each other.

Meanwhile, a plurality of the pallet contacts 7d may be formed in one of the fixing parts 7c along a longitudinal direction of the fixing parts 7c. In this instance, the electric power may be supplied to only one of the pallet contacts 7d. This is because the plurality of the pallets 7 should not be introduced into the chamber along the longitudinal direction. In other words, the position to supply the electric power to a front one of the pallets 7 may be different from the position to supply the electric power to the next one of the pallets 7 that is located behind the front one.

For example, a pallet contact 7d in front of the pallet 7 may be a contact used when the pallet 7 is positioned in the front and a pallet contact 7d behind the pallet 7 may be a contact used when the pallet is positioned in the back.

In this instance, a moving contact of the power supplier may selectively contact with the pallet contact, when the pallet is standing in the chamber after moving. As a result, the electric power is supplied to the pallet when the pallet is standing and more stable and constant electric power supply may be enabled.

In reference to FIG. 6, the structure of the fixing part 7c provided in the pallet 7 will be described in detail.

The fixing part 7c may include an adjusting plate having a plurality of holes 71 formed therein to be connected with the jig 7b. If the plurality of the jigs 7b are coupled to the fixing part 7c, pitches between them may be adjusted.

The pitches may include pitches along a longitudinal direction and pitches along a transverse direction of the pallet 7. Accordingly, longitudinal distances and transverse distances may be adjusted between the jigs, and stable supporting of various products may be enabled.

Also, the fixing part 7c may include a fixing plate 72 disposed between the jig 7b and the adjusting plate 70 to fix the jig 7b.

Figure 6:
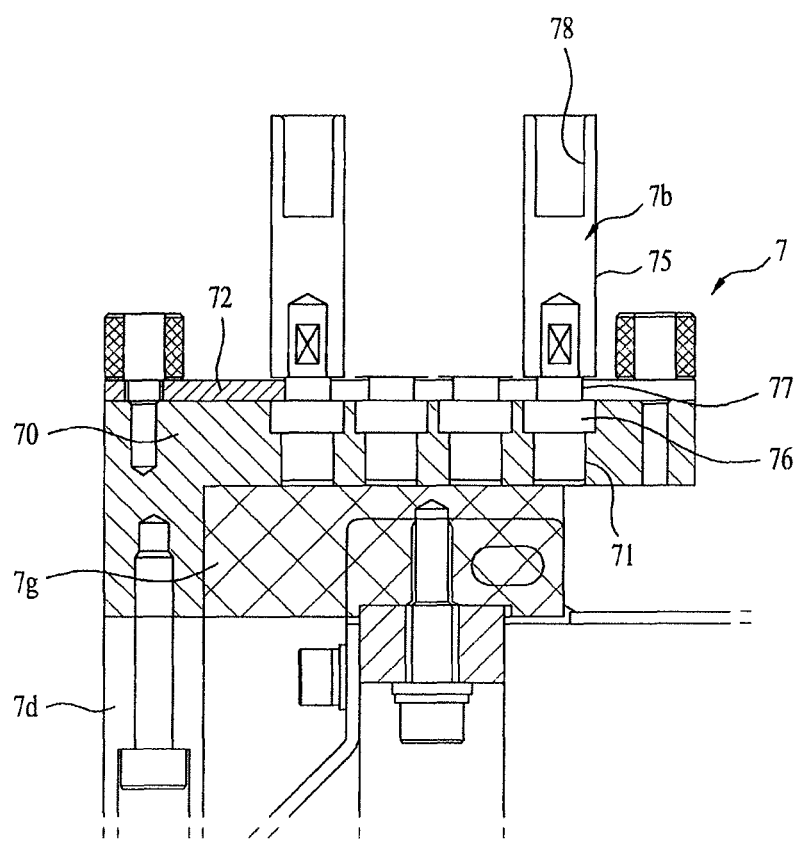
FIG. 6 is a sectional view of a fixing part provided in the pallet.

As shown in FIG. 6, the jig 7b may include a body 75 and a supporting part 76. A recess 78 may be formed in the body 75 to fixedly insert a predetermined area of the heat exchanger 5 therein. For example, a refrigerant tube provided in a lateral side of the heat exchanger 5 may be fixedly fitted to the recess 78. As a result, the shape (and/or the size) of the recess 78 may be variable according to a shape (and/or the size) of an object fitted thereto. The In this instance, the shape (and/or the size) of the recess 78 formed in the jig 7b may be variable according to the type of the heat exchanger 5. For example, the recess 78 may be formed in "U" shape. The jig 7d may be a configuration to support the heat exchanger and to transfer the electric power applied from the pallet contact 7d to the heat exchanger.

The supporting of the heat exchanger enabled by the recess 78 has following effects. That is, the shape of the recess may be the shape of the refrigerant tube such that the jig and the refrigerant tube may be in surface-contact within the recess. Accordingly, the electrical contacts may form a surface to enable the electric power to be supplied stably and uniformly.

Here, the area formed by the electrical contacts is very important. If the electric power is supplied only to a specific point intensively, there might be a spark. Such a spark might interfere with stable plasma reaction and it might be difficult to form the uniform functional film.

As a result, the supporting of the product enabled by the recess 78 of the jig is quite efficient and preferable.

The supporting part 76 of the jig 7b may be rod-shaped and a slot 77 with a small radius may be formed in the supporting part 76.

Figure 7:
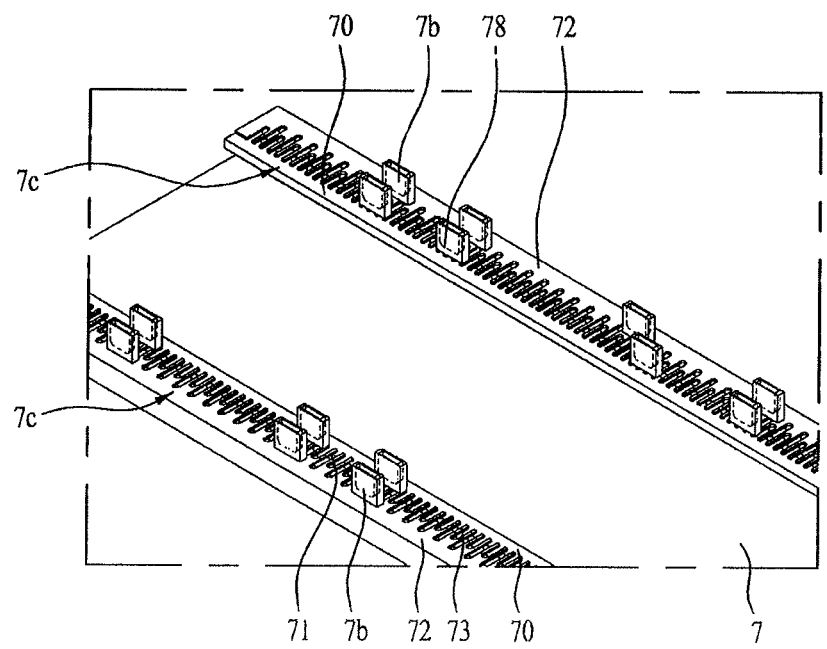
FIG. 7 is a perspective view of the pallet.

In reference to FIGS. 7 and 8, the coupling among the jig 7b, the adjusting plate 70 and the fixing plate 72 will be described.

The plurality of the holes 71 may be formed in the adjusting plate 70 as mentioned above. The plurality of the holes 71 may be formed in a preset pattern. For example, two holes 71 may be formed along a longitudinal direction of one of the fixing parts 7c and a single hole may be formed. Such a pattern may be repeated. As a result, the width of the jigs 7b may be adjusted by such that the plurality of the holes 71 and the plurality of the heat exchangers 5 may be loaded on a single fixing part 7c. In this instance, the various heat exchangers 5 may be supported stably. This is because the pitches between the jigs along the longitudinal direction and the pitches along the transverse direction can be adjusted by the pattern of the holes.

The supporting part 76 of the jig 7b may be supported by being inserted in a specific hole of the adjusting plate 70. In this instance, the fixing plate 72 may fix the jig 7b to the adjusting plate 70 stably.

Figure 8:
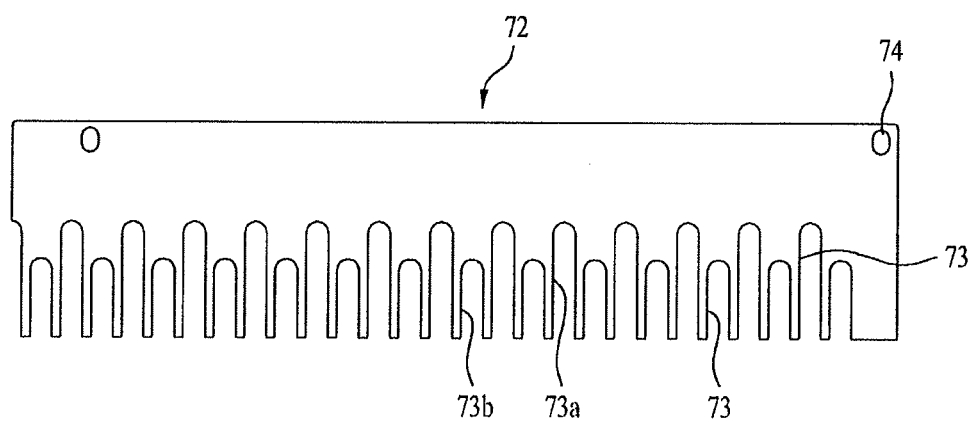
FIG. 8 is a perspective view of a fixing plate provided in the pallet.

Specifically, as shown in FIG. 8, a plurality of slots 73 may be formed in the fixing plate 72, corresponding to the holes 71 of the adjusting plate 70. The width of the slot 73 may be smaller than the diameter of the hole 71 formed in the fixing plate 72. The width of the slot 73 may correspond to the width of the slot 77 formed in the supporting part 76. Also, the slot 73 may be open toward a preset direction.

As a result, the fixing plate 72 may slide on the adjusting plate 70, when the jig 7b is inserted to the hole 71 of the adjusting plate 70.

In other words, the fixing plate 72 may slide, with the slot of the supporting part 77 inserted in the slot 73 of the fixing plate 72. After that, the fixing plate 72 may be fixed to the adjusting plate 70 and the jig 7b may be coupled to the adjusting plate 70 stably. To fix the fixing plate 73 to the adjusting plate 70, a coupling hole 74 may be formed in the fixing plate 73.

Such a structure may enable the fixing and the adjusting of the jig 7b. As a result, the structure may deal with the various sizes and types of the heat exchangers 5 efficiently and easily.

An electric pole will be described in detail in reference to FIG. 9 as follows.

An electric pole 16 may include at least a couple of electric surfaces facing each other. In other words, the electric surfaces may be formed at both sides of the object.

The electric surfaces 160 may be provided in the partition wall 18 or the side door 12c. Such an electric surface 160 shown in FIG. 9 may include a net-shaped (or mesh-shaped) plasma reacting surface 161 and an electric pole holder 162 supporting the plasma reacting surface 161 at each of both sides of the plasma reacting surface 161.

Also, a holder coupler 163 may be provided in an inner wall of the chamber 1 to support the electric pole holder 162. The inner wall of the chamber 1 may be an inner wall of the side door 12c or an inner wall of a partition wall 18.

When the plasma reaction is repeatedly performed, the plasma reacting surface 161 might be increased (or be elongated) to droop disadvantageously and the plasma reaction might not be performed uniformly. To solve the problem, a tensile force may be applied to the plasma reacting surface 161.

For that, the holder coupler 163 may be elastically supported to generate an elastic force in an outward direction of the holder coupler 163. In other words, a spring 164 may be provided behind the holder coupler 163. When the electric pole holder 162 is coupled to the holder coupler 163 for the first time, the holder coupler 163 may be in a state similar to a spring being tensioned. When the plasma reacting surface 161 is loose, the tensile force may be applied to the plasma reacting surface 161 by a restitution (or recovery) of the spring.

Meanwhile, the electric surface 160 may include a multi-stair (or a multi-step). As a result, the electric surface 160 having the plasma reaction performed thereon may be selectively controlled based on the height of the object.

Figure 9:
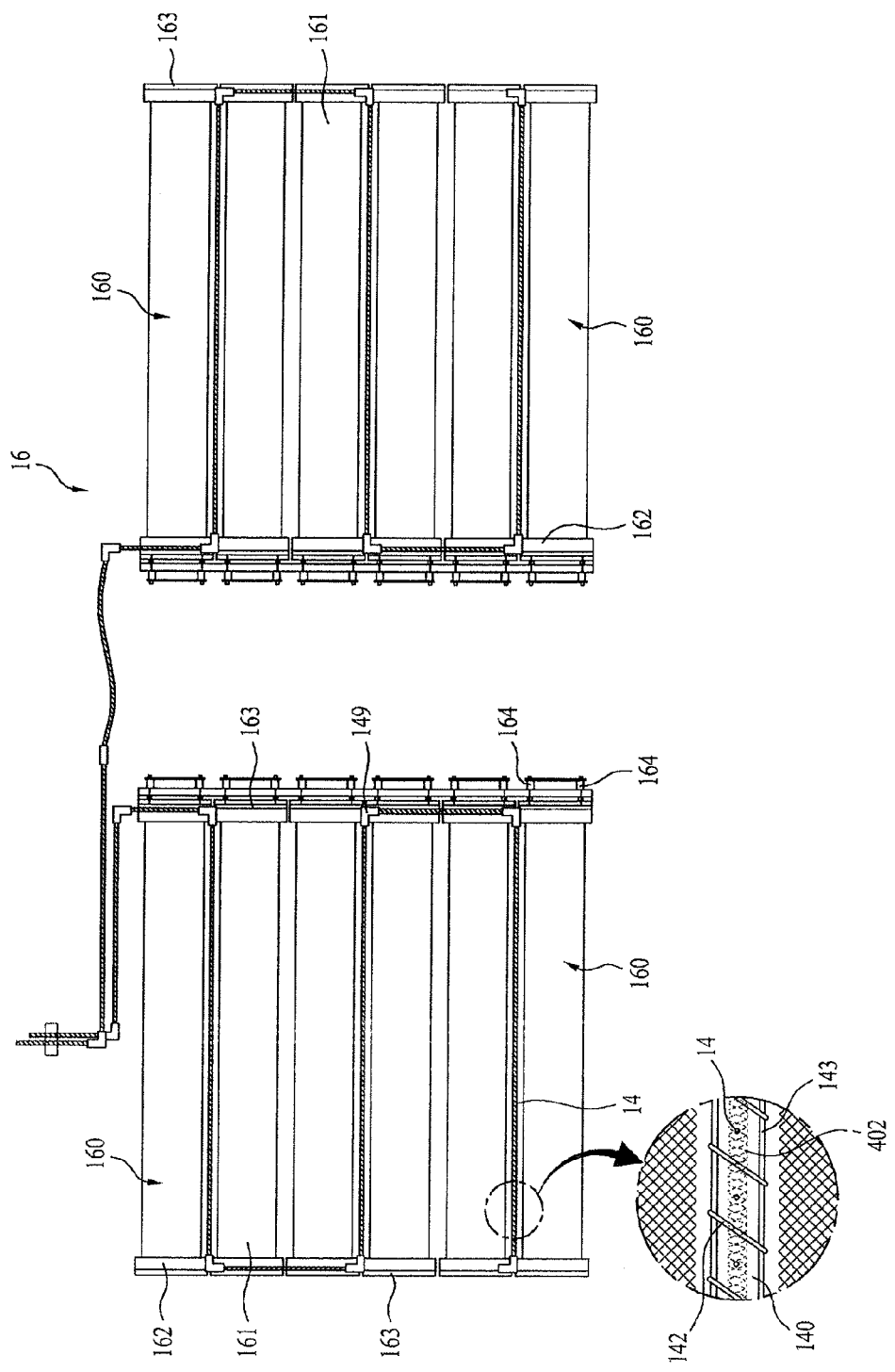
FIG. 9 shows an electric pole.

As shown in FIG. 9, a nozzle 14 may be positioned between the electric surfaces 160. A reaction gas, a precursor and a carrier gas may be supplied via a nozzle 14.

In this instance, the nozzle 14 may be formed in a circular tube 140. In other words, the gases flowing along the circular tube 140 may be supplied to the object via the nozzle 14 formed in a front side of the circular tube 140.

Meanwhile, the plurality of the circular tubes may be provided. The plurality of the circular tubes may be provided along the electric pole longitudinally or perpendicularly. The precursor and the other parts may be substantially provided into the chamber by the circular tubes provided longitudinally.

In this instance, the circular tubes may be in communication with each other via both side fittings 149 to be replaced when they are damaged. The circular tubes may have the same length. Accordingly, auxiliary circular tubes having various lengths need not be prepared. A heater may be buried in the circular tube via cover, which will be described later, such that the circular tubes may enable the electric power to be supplied to the heater.

The position of the circular tube 140 may be in front of the electric surface 160. In other words, the circular tube may be closer to the object. Accordingly, the nozzle 14 may be prevented from being clogged noticeably.

The plasma reaction may be performed by the reaction gas, the precursor and the carrier gases supplied via the nozzle. There might be difference between the supply of the precursor from the position where the reaction is performed and the supply of the precursor to the position where the reaction is performed.

When the precursor is supplied from the position where the reaction is performed, most of the supplied precursors can be used in the plasma reaction and a pressure difference between a nozzle inside and a nozzle outside may be maintained constantly. Accordingly, the precursors may be supplied via the nozzle constantly. However, when the precursor is supplied from the position where the reaction is not performed to the position where the reaction is performed, a predetermined amount of the supplied precursors cannot be used in the plasma reaction. Accordingly, the pressure of the nozzle outside might be high and nozzle clogging might be generated. As a result, the position of the circular tube, that is, the position of the nozzle may be located in front of the electric surface 160. In other words, the nozzle may be closer to the plasma object than the electric surface.

A heater 402 may be provided in the circular tube 140 to heat the gases and the like so as to enable the gas and the like to flow smoothly therein. However, the heater 402 might be easily damaged by the plasma reaction. Thus, it may not be preferable that the circular tube 140 is integrally formed with the heater 402.

Accordingly, to ease installation and repair, the heater 402 may be buried in a rear surface of the circular tube and a cover 143 may be provided, before fixing a wire (or a heating wire) 142.

In this instance, the plurality of the circular tubes 140 may be provided, with the nozzle 14 formed therein. Such the circular tubes may be in communication with each other via both side fittings 149. Accordingly, if damage is generated in one of the circular tubes, for example, nozzle clogging or heater damage, only the damaged circular tube may be replaced.

In reference to FIGS. 11 and 12, a power supplier 80 to supply an electric power to the pallet will be described in detail as follows.

The electric pole 16 mentioned above may be provided in the chamber 1. In other words, the electric poles 16 may face the partition wall 18 and the side door 12*c* within the chamber 1, respectively. The heat exchanger 5 may be positioned between the electric poles 16.

For the plasma reaction, a pole of the electric pole 16 may be opposite to a pole of the heat exchanger 5. According to the embodiment of the invention, a positive pole (anode) may be the pole of the heat exchanger 5 and a negative pole (cathode) may be the pole of the electric pole 16.

To supply the electric power to the heat exchanger 5, more specifically, to the pallet 7, a power supplier 80 may include a moving contact 81. In detail, the moving contact 81 may be distant from the pallet 7 while the pallet 7 is conveyed. The moving contact 81 may be closer to the pallet 7 to make contact with the pallet 7 for the plasma reaction. An air cylinder 86 may be provided to realize such the moving contact 81. Accordingly, the moving contact 81 may be moved forwardly and backwardly by the operation of the air cylinder 86 basically.

In other words, the moving contact 81 may selectively be in contact with the contact 7*d* of the pallet 7. The moving contact 81 and the contact 7*d* of the pallet 7 may include plane surfaces, respectively. The plane surfaces may make surface-contact with each other, to supply the electric power more stably.

Also, the moving contact 81 may be elastically supported. That is, when the moving contact 81 is in contact with the pallet 7 after a movement, the moving contact 81 may move further for a predetermined distance. The distance may be a distance that enables the contact to be compensated reliably by the elastic support. As a result, even if a vibration is generated, the elastic support may perform the stable supply of the electric power.

Meanwhile, the power supplier 80 may include a switch 82' or a switch member. The switch 82 selectively supplies the electric power to the moving contact 81 based on elastic deformation of the moving contact 81.

Specifically, the power supplier 80 may include a contact receiving part 82 to receive the moving contact 81. The moving contact 81 may be elastically supported by an elastic member 81' within the contact receiving part 82. The elastic member may be a spring provided in the contact receiving part 82. Accordingly, the contact receiving part 82 may move forwardly even when the moving contact contacts with the pallet contact. In this instance, the moving contact 81 may not move forwardly and the elastic member provided between the moving contact and the contact receiving part may be elastically transformed.

The switch member 82' may be a shaft. An end of the switch member may be selectively and electrically connected with the moving contact and the other end of the switch member may be connected with a power line (not shown).

In this instance, the switch member may be electrically connected with the moving contact, when the moving contact 81 is advancing by the elastic force. Accordingly, the electric power may be supplied more stably.

A safety plate 85 may be provided behind the contact receiving part 82. Also, a plurality of connecting members 84 may be provided to determine the forward and backward moving distance, the position and the height thereof. The connecting members may be block-shaped. Specifically, the blocks may include horizontal blocks 84*a* and vertical blocks 85*b*.

In this instance, a through hole 87 may be formed in one of the horizontal blocks and the electric power may be supplied to the moving contact 81 via a power line passing through the through hole.

Meanwhile, the connecting member 84 may be disposed between the safety plate 85 and the moving contact receiving part 82. The connecting member 84 may perform an insulation function for both of them. For that, the connecting member may be formed of a ceramic material.

Figure 10:
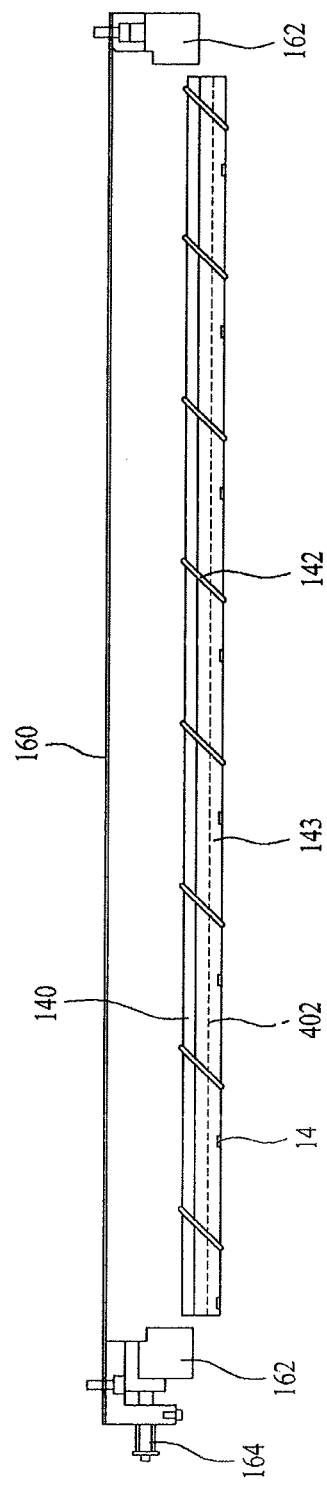
FIG. 10 is a plane view of the electric pole.
Figure 11:
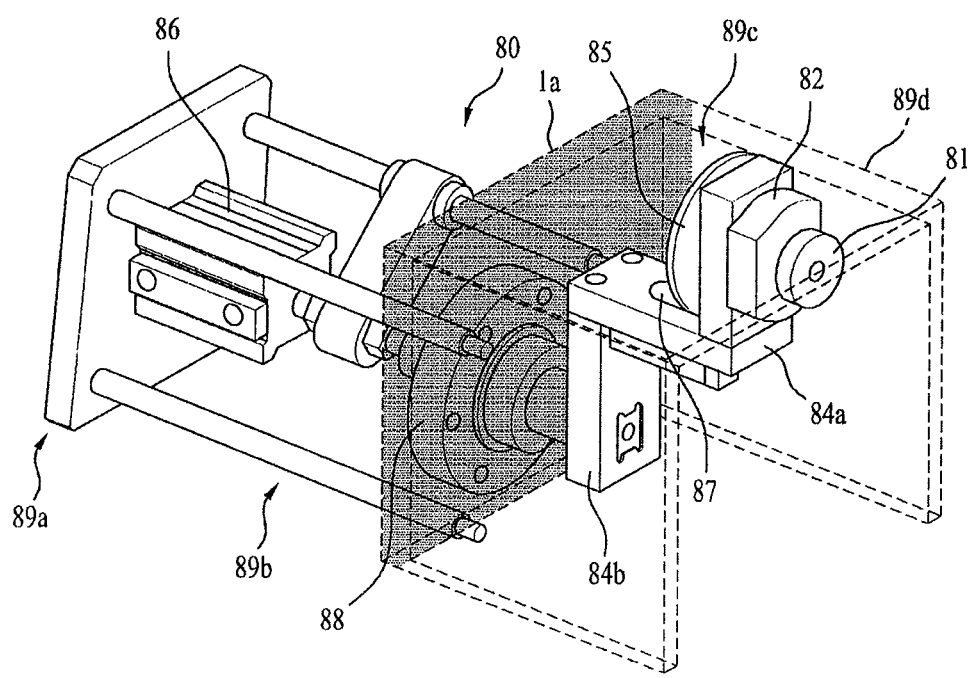
FIG. 11 is a perspective view of a power supplier.
Figure 12:
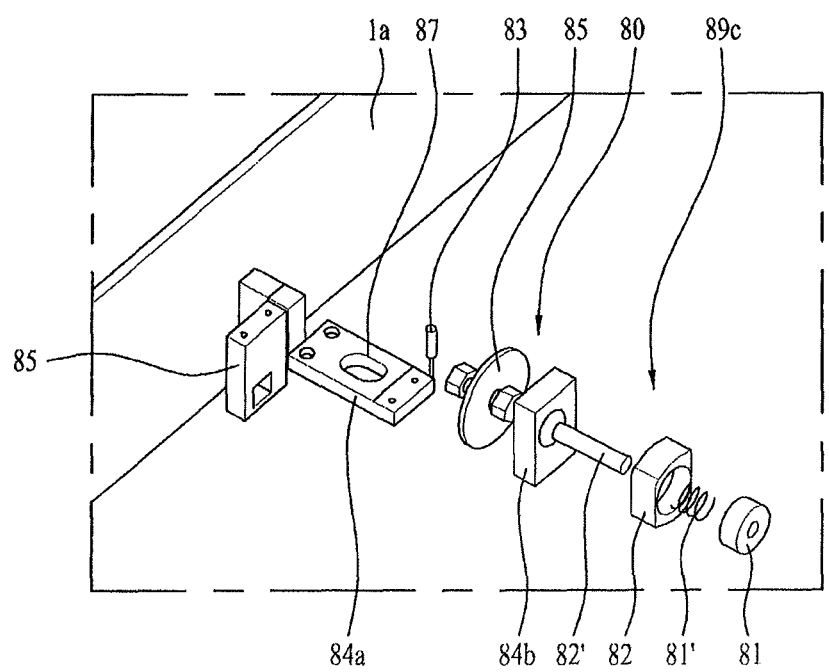
FIG. 12 is an exploded perspective view of the power supplier.

FIG. 11 shows an entire appearance of the power supplier 80. The power supplier 80 may include a base 89*a*, a moving generation part 89*b* and a moving contact part 89*c*. Specifically, the base 89*a* and the moving generation part 89*b* may not be exposed outside. As a result, FIG. 10 shows that only the moving contact part 89*c* is exposed within the chamber. In other words, a line referenced to as '1*a*' means a boundary between the inside of the chamber and an internal wall of the chamber.

Such the configuration may minimize the area occupied by the power supplier 80 provided in the chamber. In other words, the moving generation part 89*b* is not exposed to the inside of the chamber and the moving contact part may be moved stably accordingly.

The power supplier 80 may include a safety switch 83. Such a safety switch 83 may be functioned as a switch configured to apply or block an electric power according to the movement of the moving contact part. In other words, the safety switch 83 may be moved by the safety plate 85. When the moving contact part advances forwardly, the safety switch 83 may not contact with the safety plate. Reversely, when the moving contact part retreats, the safety plate may contact with the safety switch to retreat the safety switch.

As a result, the safety switch 83 may be movable between a front position and a rear position by the safety plate 85. Specifically, the switch member 83*a* of the safety switch 83 may be moved between the front position and the rear position by the safety plate 85.

In the rear position of the safety switch, the power supplier 80 blocks the electric power applied to the moving contact part. As a result, even when the controller controls the power supplier to apply the electric power, the power supply can be substantially blocked by the safety switch. Accordingly, more stable and safe power supply may be enabled.

Meanwhile, there may be formed a region having the electric power applied thereto in the moving contact part 89*a*. When the moving contact part is exposed to the inside of the chamber, a functional film might be formed on a surface of the moving contact part 89*a*. To prevent the unnecessary functional film, a cover 89*d* may be provided.

The cover may cover a top and sides, that is, a top surface and lateral surfaces of the moving contact part. A front surface of the moving contact part may be open to move the moving contact. Also, a rear surface of the moving contact part may be closed but the rear surface faces the inner wall 1*a*. Accordingly, the rear surface needs not be closed.

A sealing member 88 may be provided between the moving contact part and the moving generation part. In other words, sealing may be provided to the inner wall 1*a*, to partition the chamber inside and the inner wall. As a result, the sealing may be performed by using an insulating material, to prevent the electric power applied to the moving contact part from being applied to the moving generation part.

According to the embodiment of the invention described above, the control unit 500 may appropriately control the precursor supply unit 400, the reaction gas supply unit 300, the cleaning gas supply unit 200 and the exhaustion unit 100 connected with the single chamber 1. Accordingly, the functional film may be formed on the heat exchanger 5. Furthermore, the multi-functional precursor having the corrosion resistance, hydrophilicity and antibiotic functions at the same time may be used. Accordingly, the corrosion resistant, hydrophilic and antibiotic functional film may be formed in the single chamber 1 at one time.

The heat exchanger is presented in the embodiments mentioned above and the embodiments of the invention are not limited to the heat exchanger. For example, a side mirror for a vehicle can be applied to the embodiments of the invention.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments. Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A plasma enhanced chemical vapor deposition apparatus for forming a functional film on a heat exchanger, the apparatus comprising:
   a loading station to load the heat exchanger on to a pallet;
   an operating station to receive the pallet from the loading station, and provide the functional film on the heat exchanger positioned on the pallet by using a plasma reaction, the operating station including a chamber to hold the heat exchanger therein;
   an unloading station to unload the heat exchanger having the functional film coated thereon from the pallet;
   at least one conveyer to return the pallet from the unloading station to the loading station;
   a power supplier to selectively supply electric power to the pallet; and
   at least one electric pole to be supplied with electric power of an opposite polarity to a polarity of the electric power of the power supplier,
   wherein the power supplier and the electric pole are provided inside the chamber.

2. The apparatus according to claim 1, further comprising an entry door provided to the chamber to selectively open and close the chamber.

3. The apparatus according to claim 2, wherein the at least one conveyer includes a front part provided in front of the entry door to convey the pallet in to the chamber.

4. The apparatus according to claim 1, wherein the at least one conveyer includes a first elevator to move the pallet vertically.

5. The apparatus according to claim 1, wherein the at least one conveyer includes an internal part provided inside the chamber.

6. The apparatus according to claim 2, further comprising an exit door provided in the chamber in an opposite position to the entry door to selectively open and close the chamber.

7. The apparatus according to claim 1, wherein the at least one conveyer includes a rear part provided behind the exit door to convey the pallet out of the chamber.

8. The apparatus according to claim 7, wherein the rear part includes a second elevator to move the pallet vertically.

9. The apparatus according to claim 1, wherein the at least one electric pole includes at least a pair of conductive members facing each other.

10. The apparatus according to claim 9, further comprising a side door provided to a lateral side of the chamber to selectively open and close the chamber, and one of the conductive members is provided to the side door.

11. The apparatus according to claim 10, wherein each conductive member includes;
   a plasma reacting member; and
   a pair of electric pole holders to hold the plasma reacting member at both sides of the plasma reacting member, respectively.

12. The apparatus according to claim 11, further comprising a holder coupler to support the at least a couple of electric pole holders, wherein the holder coupler is elastically supported to generate an elastic force in an outward direction of the holder coupler.

13. The apparatus according to claim 12, wherein the conductive members form a plurality of slots and a nozzle is provided between the conductive members to supply a reaction gas, a precursor and a carrier gas.

14. The apparatus according to claim 13, further comprising a circular tube, wherein the nozzle is formed along a longitudinal direction of a front part of the circular tube, and a heating wire is wound along a longitudinal direction of a rear part of the circular tube.

15. The apparatus according to claim 14, wherein the circular tube is located in front of the conductive member.

16. The apparatus according to claim 1, wherein the power supplier includes a moving contact to selectively contact with a pallet contact of the pallet.

17. A plasma enhanced chemical vapor deposition apparatus comprising:
   a loading station to load an object on a pallet;
   an operation station to form a functional film by performing plasma reaction to the object loaded on the pallet;
   a unloading station to separate the object from the pallet;
   a circulation station to convey the pallet from the unloading station to the loading station; and
   a conveyer to convey the pallet to the stations sequentially to circulate the pallet,
   wherein the operation station comprises:
      a chamber to receive the object therein;
      a power supplier to selectively supply an electric power to the pallet within the chamber; and
      an electric pole having an opposite polarity to the power supplier.

* * * * *